(12) United States Patent
La Fontaine et al.

(10) Patent No.: US 6,535,280 B1
(45) Date of Patent: Mar. 18, 2003

(54) PHASE-SHIFT-MOIRÉ FOCUS MONITOR

(75) Inventors: Bruno La Fontaine, Pleasanton, CA (US); Jongwook Kye, Pleasanton, CA (US); Harry Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/944,794

(22) Filed: Aug. 31, 2001

(51) Int. Cl.$^7$ ............................. G01J 1/00; G01B 9/00
(52) U.S. Cl. .................... 356/123; 356/124; 356/399; 356/400
(58) Field of Search ................... 356/123, 124, 356/124.5, 125, 399, 401; 430/5, 30, 320–323

(56) References Cited

U.S. PATENT DOCUMENTS

| | | | | |
|---|---|---|---|---|
| 3,768,911 A | * | 10/1973 | Erickson ..................... | 356/123 |
| 4,211,489 A | * | 7/1980 | Kleinknecht et al. ....... | 356/400 |
| 4,629,325 A | * | 12/1986 | Bergkvist et al. .......... | 356/399 |
| 4,786,166 A | * | 11/1988 | Kroko ......................... | 356/123 |
| 4,929,083 A | * | 5/1990 | Brunner ....................... | 356/123 |
| 5,075,562 A | * | 12/1991 | Greivenkamp, Jr. et al. ................ | 250/561 |
| 5,308,722 A | * | 5/1994 | Nisler ........................... | 430/5 |
| 5,406,375 A | * | 4/1995 | Brandstetter ................ | 356/124 |
| 6,171,739 B1 | * | 1/2001 | Spence et al. ................ | 430/30 |

FOREIGN PATENT DOCUMENTS

JP 03 116 412 * 5/1991

OTHER PUBLICATIONS

New Phase Shift Gratingsfor Measuring Aberrations, by Hiroshi Nomura, published by SPIE, dated Feb. 27, 2001 (11 pages).

* cited by examiner

Primary Examiner—Frank G. Font
Assistant Examiner—Sang H. Nguyen

(57) ABSTRACT

An optical monitor includes a body having a first plurality of parallel, substantially opaque, spaced apart lines thereon, and the second plurality of parallel, substantially opaque, spaced apart lines thereon, with a relatively small angle between the first and second pluralities of lines. A an image of the lines of the first plurality thereof is provided on the semiconductor body, upon relative movement of the monitor toward and away from the semiconductor body, the line images move relative to the semiconductor body. The images of the lines of the second plurality thereof provided on the semiconductor body move in a different manner upon relative movement if the monitor toward and away from the semiconductor body: The moiré fringe formed on the semiconductor body from images of the first and second plurality of lines during such movement is analyzed in order to achieve proper focus of the image on the semiconductor body.

14 Claims, 11 Drawing Sheets

+200 nm

3°      5°      7°

+100 nm 0 nm

−100 nm

−200 nm

PHASE-SHIFT-MOIRÉ FOCUS MONITOR

BACKGROUND OF THE INVENTION

1. Field of the Invention

This invention relates generally to optical apparatus in semiconductor technology, and more particularly, to a test monitor for use in focusing an image on a semiconductor wafer.

2. Discussion of the Related Art

Typically, an optical system 30 (FIG. 1) used for patterning photoresist 32 on a semiconductor wafer 34 comprises a light source 36, a mask or reticle 38 having opaque lines 40 and transparent portions 42, and a lens 44, the light from the light source 36 passing through the transparent portions 42 of the mask/reticle 38 through the lens 44 and to the photoresist 32, with light being blocked from reaching the lens 44 (and photoresist 32) by the opaque lines 40 of the 38 mask/reticle.

As is well known, there is a need to position the wafer 34 at a proper distance with respect to the lens 44 so that images that fall on the photoresist 32 of the wafer 34 will be in the plane of best focus.

Typically, prior to actual fabrication of semiconductor devices, a test focus monitor in the form of for example a reticle is used as part of the overall system to achieve proper focus of the image on the wafer. An example of such a monitor is shown and described in the paper entitled "New Phase Shift Gratings For Measuring Aberrations", by Hiroshi Nomura, published by SPIE, dated Feb. 27, 2001, which is herein incorporated by reference. FIGS. 2–4 herein show a monitor 50 configured as shown in FIGS. 3 and 5 of that paper. The monitor 50 is made up of a quartz base 52 which is transparent to light, and which has a plurality of parallel, opaque, spaced apart lines 54 on the base 52, the lines 54 having a first set of adjacent ends 55, and a second, opposite set of adjacent ends 56. The area between each adjacent pair of lines 54 is transparent to light and is made up of regions 58 which pass light therethrough without changing the phase thereof, and regions 60 which pass light therethrough which shift the phase of such light by 90° (the phase shifting caused by recesses 62 in the base 52—FIGS. 3 and 4 and the above cited paper). Each of the lines 54 has a region 58 and a region 60 which are aligned along and on one side thereof, and a region 58 and a region 60 which are aligned along and on the opposite side thereof. Each of the lines 54 has a region 58 on one side thereof opposite a region 60 on the other side hereof, these regions 58, 60 running from end 55 of that line to adjacent to the middle thereof, and furthermore, each of the lines 54 has a region 60 on the one side thereof opposite a region 58 on the other side thereof, these regions 60, 58 running from end 56 to adjacent the middle thereof.

FIGS. 3 and 4 are views similar to that shown in FIG. 1, but incorporating the monitor 50 of FIG. 2 as a part of the system 30. FIG. 3 includes a sectional view of the monitor 50 taken along the line 3—3 of FIG. 2, showing a cross-section of the upper area 50A of the monitor 50, wile FIG. 4 includes a sectional view of the monitor 50 taken along the line 4—4 of FIG. 2, showing a cross-section of the lower area 50B of the monitor 50. As will be seen, with reference to the upper area 50A of the monitor 50 (FIG. 3), moving the wafer 34 and lens 44 relatively together and apart causes the shadows 64A, 64B, 64C formed on the photoresist 32 of the wafer 34 (formed by the opaque lines 54) to shift (downward as the wafer 34 and lens 44 are moved relatively further apart). Meanwhile, with reference to the lower area 50B of the monitor 50 (FIG. 4), moving the wafer 34 and lens 44 relatively together and apart causes the shadows 64D, 64E, 54F formed on the photoresist 32 of the wafer 34 to shift (upward as the wafer 34 and lens 44 are moved relatively further apart). The dotted lines 66 in FIGS. 3 and 4 indicate the traverse of the shadows 64A, 64B, 64C, 64D, 64E, 64F as the wafer 34 is so moved relatively toward and away from the lens 44.

These paths are plotted in FIG. 5, and the intersections thereof indicate the best focus of the image on the wafer 34.

FIG. 6 includes FIGS. 6A–6F which are views taken along the lines 6A—6A, 6B—6B, 6C—6C, 6D—6D, 6E—6E, and 6F—6F of FIGS. 3 and 4. With the wafer 34 and lens 44 closest together as shown in FIGS. 3 and 4, FIGS. 6A and 6D show the simultaneous positions of the shadows 64A–64F on the photoresist 32 determined by the respective areas 50A, 50B of the monitor 50 With the wafer 34 and lens 44 so positioned relative to each other, the photoresist 32 is exposed to light from the light source 36 and is then developed to determine photoresist lines, which corresponds to the positions of the shadows 64A–64F. As will be seen, the lines of FIGS. 6A and 6D are misaligned As the wafer 34 and lens 36 are moved relatively further apart to an intermediate position as shown in FIGS. 3 in 4, FIGS. 6B and 6E show the simultaneous positions of the shadows 64A–64F on the photoresist 32 determined by the respective areas 50A, 50B of the monitor 50. Again, the photoresist 32 is exposed to light from the light source 36 and is then developed to determine photoresist lines that correspond to the positions of the shadows 64A–64F. As will be seen, the lines of FIGS. 6B and 6E are substantially in alignment. Then, as the wafer 34 and lens 44 are moved relatively further apart, i.e., to their most far apart positions as shown in FIGS. 3 and 4, FIGS. 6C and 6F show the simultaneous is positions of the shadows 64A–64F on the photoresist 32 determined by their respective areas 50A, 50B of the monitor 50. Again, with the wafer 34 and lens 44 so positioned relative to each other, the photoresist 32 is exposed to a light from the light source 36 and is then developed to determine photoresist lines, which correspond to the positions of the shadows 64A–64F. As will be seen, the lines of FIGS. 6E and 6F are misaligned.

It will be seen that changing the distance between the lens 44 and wafer 34 causes the shadows 64 A–64C to move further in and out of alignment with the shadows 64D–64F. The process of moving the lens 44 and wafer 34 relatively closer together and further apart, along with the corresponding exposure and development of the photoresist 32 accompanying each adjustment is repeated until the lines formed in the photoresist 32 are substantially straight. This is illustrated in FIG. 6 of the above cited paper.

While such an approach is useful, only a relatively coarse reading of focus is achievable. For example, with reference to FIG. 6 of the above cited paper, only a small shift in the pattern from top to bottom is shown over a range of 400 nm of relative movement between the wafer 34 and lens 44. With device dimensions continually being reduced, there is a need to achieve a proper reading of focus within a much smaller range of lens-wafer relative movement, for example, 200 nm or less.

Therefore, what is needed is an apparatus which is capable of providing proper focus of an image on a wafer through a very small range of relative movement between a lens and a wafer.

SUMMARY OF THE INVENTION

In the present invention, an optical tool is provided, made up of a tool body having a first plurality of parallel, substantially opaque, spaced apart lines thereon, and a second plurality of parallel, substantially opaque, spaced apart lines thereon with a relatively small angle between the first and second pluralities of lines. As an image of the lines of the first plurality thereof is provided on a semiconductor body, such line images move relative to the semiconductor body as the semiconductor body is moved relatively toward and away from the optical tool. Furthermore, as an image of the lines of the second plurality thereof is provided on the semiconductor body, such line images move relative to the semiconductor body as the semiconductor body is moved relatively toward and away from the optical tool, but in a manner different from the movement of the image of the lines of the first plurality thereof. The moiré fringe formed on the semiconductor body from images of the first and second plurality of lines is analyzed in order to achieve proper focus of an image on the semiconductor body.

The present invention is better understood upon consideration of the detailed description below, in junction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 2:
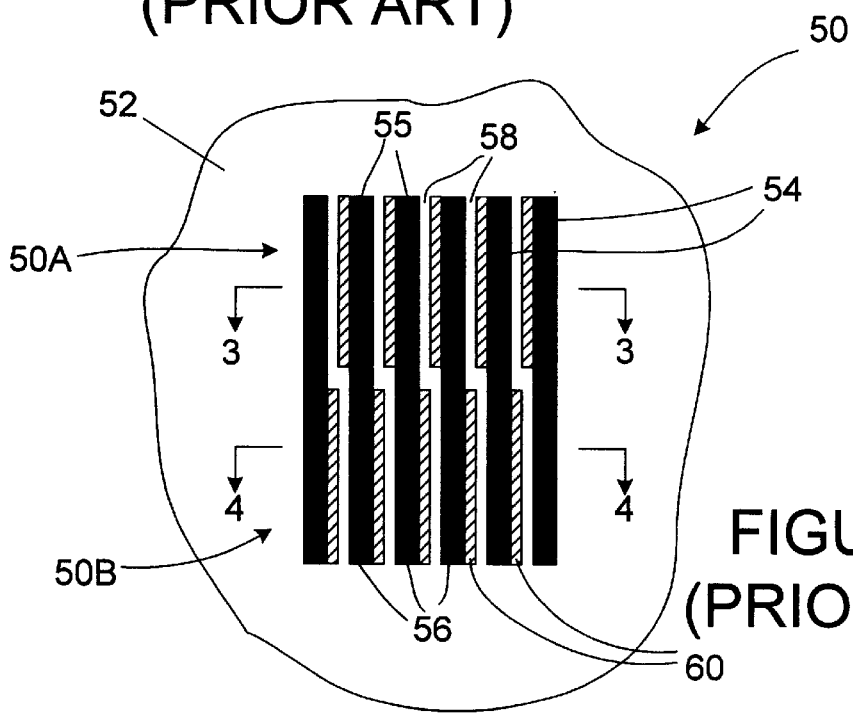
FIG. 2 is a plan view of a test focus monitor of the prior art.
Figure 7:
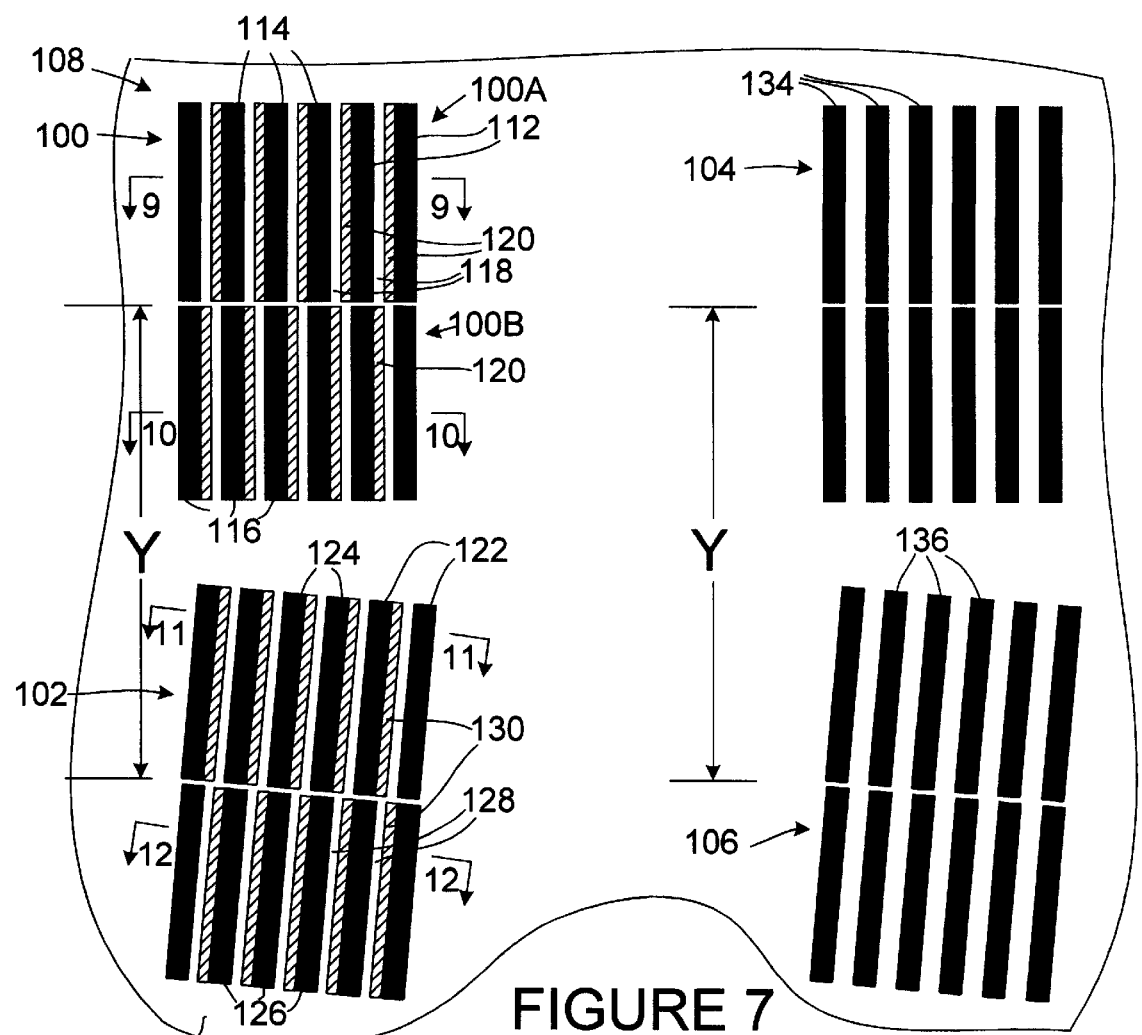
FIG. 7 is a plan view illustrating portions of the monitor of the present invention.

FIG. 7 shows portions 100, 102, 104, 106 of a monitor 108 of the present invention. The monitor 108 includes portion 100 that is like that shown in FIG. 2. That is, a quartz base 110 which is transparent to light has a plurality of parallel, opaque, spaced apart lines 112 on the base 110, the lines 112 having a first set of adjacent ends 114, and a second, opposite set of adjacent end s 116. The area between each adjacent pair of lines 112 is transparent to light and is made up of regions 118 which pass light therethrough without change in phase thereof, and regions 120 which pass light therethrough which shift the phase of such light by 90° (the phase shifting caused by recesses 121 in the base 110). Each of the lines 112 has a region 118 and a region 120 which are aligned along and on one side thereof, and a region 118 and a region 120 which are aligned along and on the opposite side thereof. Each of the lines 112 has a region 118 on one side 1hereof opposite a region 120 on the other side thereof, these regions 118, 120 running from the 114 end of that line 112 to adjacent the middle thereof. Furthermore, each of the lines 114 has a region 120 on the one side thereof opposite a region 118 on the other side thereof, these regions 118, 120 running from the end 116 to adjacent the middle thereof, all as shown and described with regard to FIG. 2 above.

Spaced a distance Y from the monitor portion 100 is the monitor portion 102. The monitor portion 102, similar to the monitor portion 100, is made up of a quartz base 110 which is transparent to light, and which has a plurality of parallel, opaque, spaced apart lines 122 on the base 110, having a first set of adjacent ends 124, and a second opposite set of adjacent ends 126. Again, the area between each adjacent pair of lines 122 is transparent to light and is made up of regions 128 that pass light therethrough without changing the phase thereof, and regions 130 that pass light therethrough which and shift the phase of such light by 90° (the phase shifting caused by recesses 132 in the base 110). Each of the lines 122 has a region 128 and a region 130 which are aligned along and on one side thereof, and a region 128 and a region 130 which are aligned along and or the opposite side thereof. Each of the lines 122 has a region 128 on one side thereof opposite a region 130 on the other side thereof, these regions 128, 130 running from end 124 of the the 122 to adjacent the middle thereof, and furthermore each of the lines 122 has a region 130 the one side thereof opposite the region 128 on the other side thereof, these regions 128, 130 running from end 126 of the line 122 to adjacent the middle thereof.

However, important differences exist between the monitor portion 100 and monitor portion 102. Initially, with regard to the phase shifting and non-phase shifting regions between adjacent pairs of lines, the positions of the phase shifting and non-phase shifting regions of the monitor portion 102 are reversed as compared to the corresponding areas of the monitor portion 100. Furthermore, the lines 122 of the monitor portion 102 are at a small angle relative to the lines 112 of the monitor portion 100. The importance of these features will be discussed further on.

Also shown in FIG. 7 are other portions 104. 106 of the monitor 108. The monitor portion 104 is similar to monitor portion 100, but includes no regions that shift the phase of the light passing through the transparent portions between the lines 134. The monitor portion 106 is similar to monitor portion 102, but again including no regions that shift the phase of light passing through the transparent portions between the lines 136. The monitor portion 104 and monitor portion 106 are spaced apart a distance Y, as are the monitor portion 100 and monitor portion 102. The lines 134 of the monitor portion 104 are parallel to the lines 112 of the monitor portion 100, and the lines 136 of the monitor portion 106 are parallel to the lines 122 of the monitor portion 102. That is to say, the angle between the lines 112, 122 is the same as the angle between the lines 134. 136.

Figure 1:
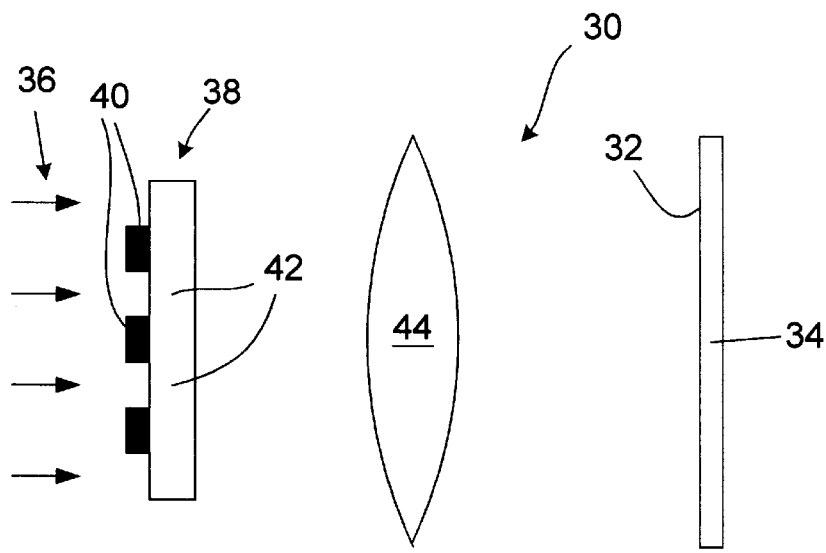
FIG. 1 is an elevational view of a typical optical system used for patterning photoresist of a semiconductor wafer.
Figure 8:
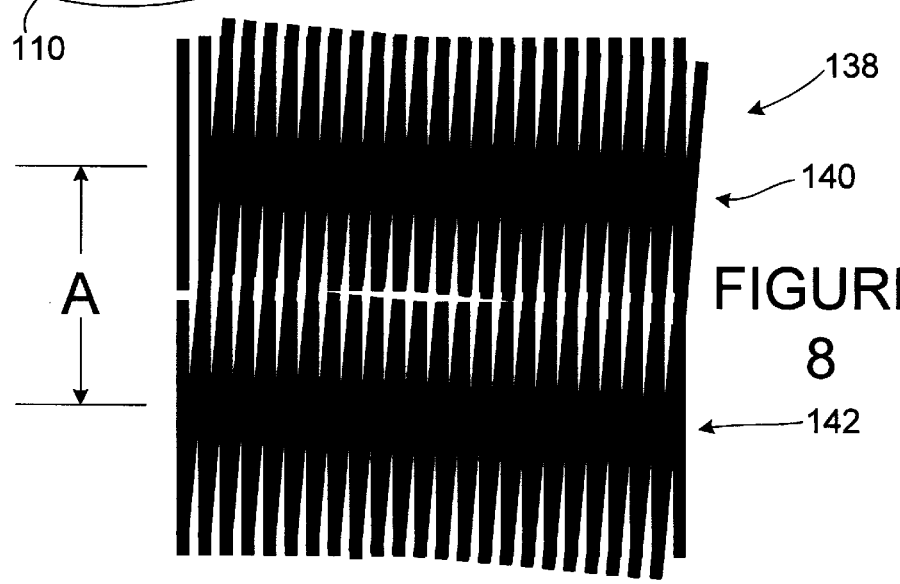
FIG. 8 illustrates moiré fringe patterns formed by use of monitor portions of FIG. 7.

Initially, the monitor portion 104 is used in the apparatus 30 of FIG. 1. This results in shadows being formed on the photoresist 32 of the wafer 34 which correspond to the lines 134. The monitor 108 is then moved a distance Y as shown in FIG. 7, so that the shadow portions formed by the monitor portion 106 overlie the lines formed in the photoresist 32. The photoresist 32 is then developed resulting in the pattern of lines 138 shown in FIG. 8. Because of the angle between the lines 134 and the lines 136, moiré fringes 140, 142 are revealed as shown in FIG. 8. With the distance Y being held constant for this operation, it will be understood that the distance A between the revealed moiré fringes 140, 142 will remain constant whenever this operation is repeated. Furthermore, with no phase shift regions in the monitor portions 104, 106, the distance between the moiré fringes 140,142 formed on the photoresist 32 will be substantially the same over a range of distances between the lens 44 and wafer 34. Thus, the image as shown in FIG. 8 can be used as a reference, as will be described further on.

Figure 3:
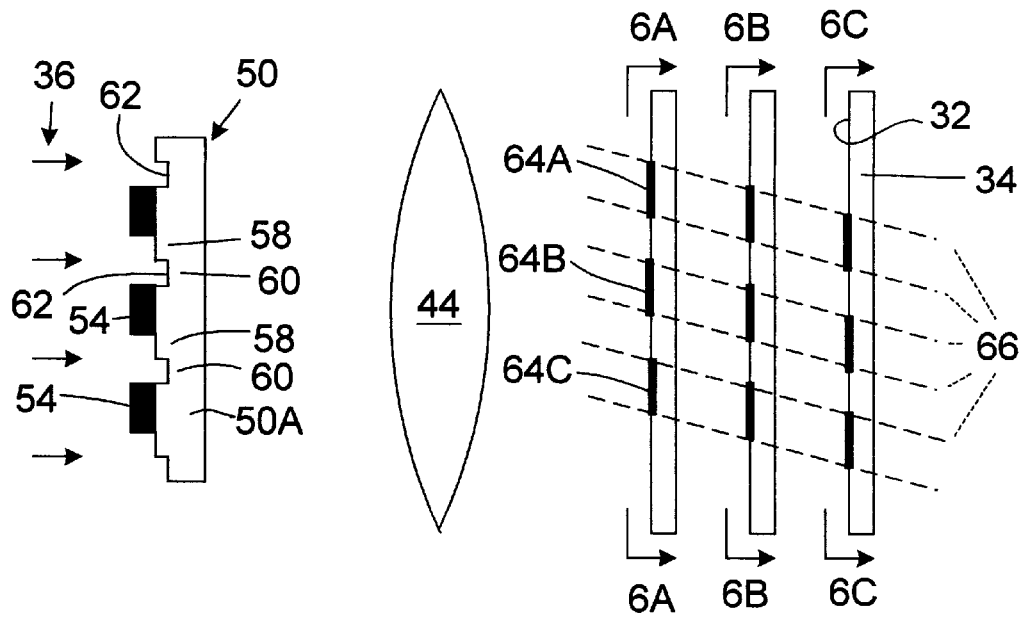
FIG. 3 is an elevational view of an optical system illustrating use of the test focus monitor of FIG. 2.
Figure 4:
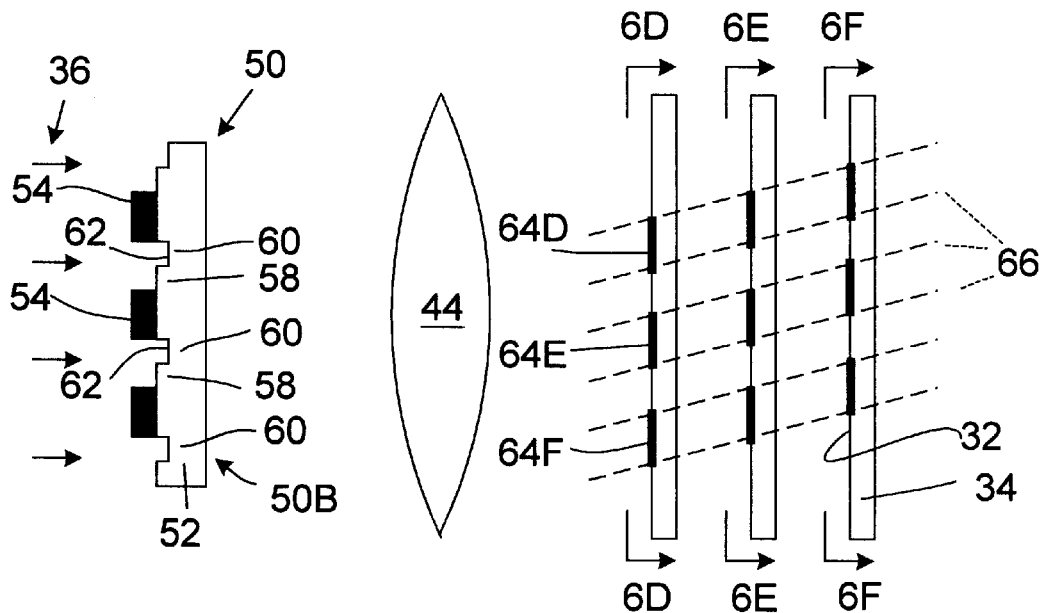
FIG. 4 is an elevational view similar to that shown in FIG. 3 again illustrating use of the test focus monitor of FIG. 2.
Figure 5:
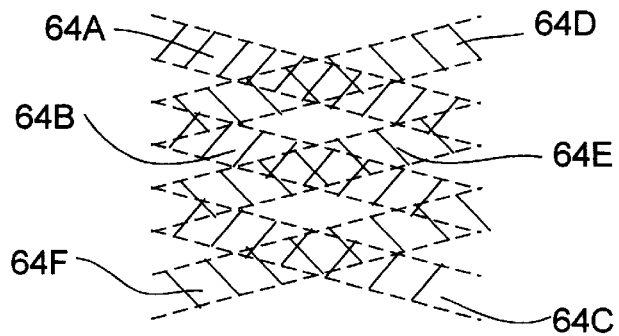
FIG. 5 is an elevational view showing the paths of the shadows falling on the wafer as the optical system of FIGS. 3 and 4 is used.
Figure 9:
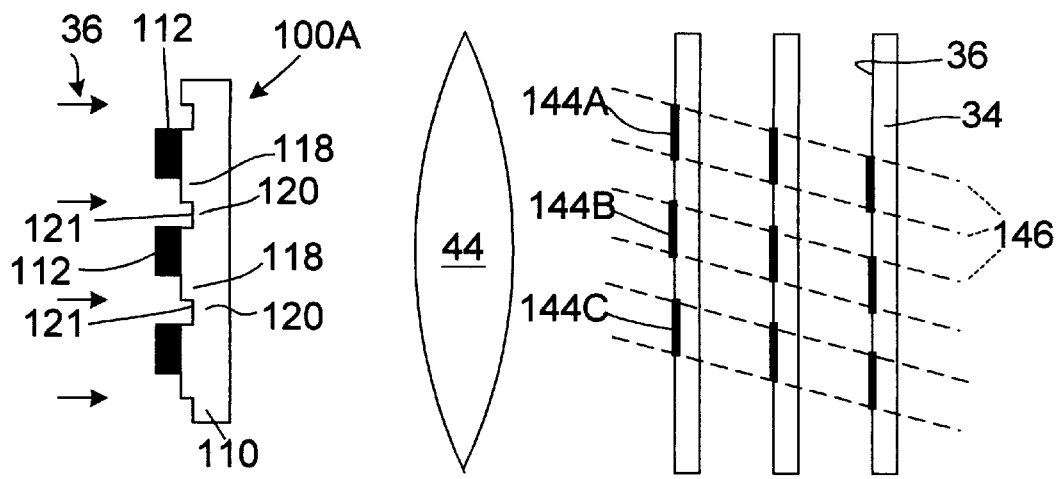
FIG. 9 is a view similar to that shown in FIG. 3, illustrating operation of the upper area of a monitor portion shown in FIG. 7.
Figure 10:
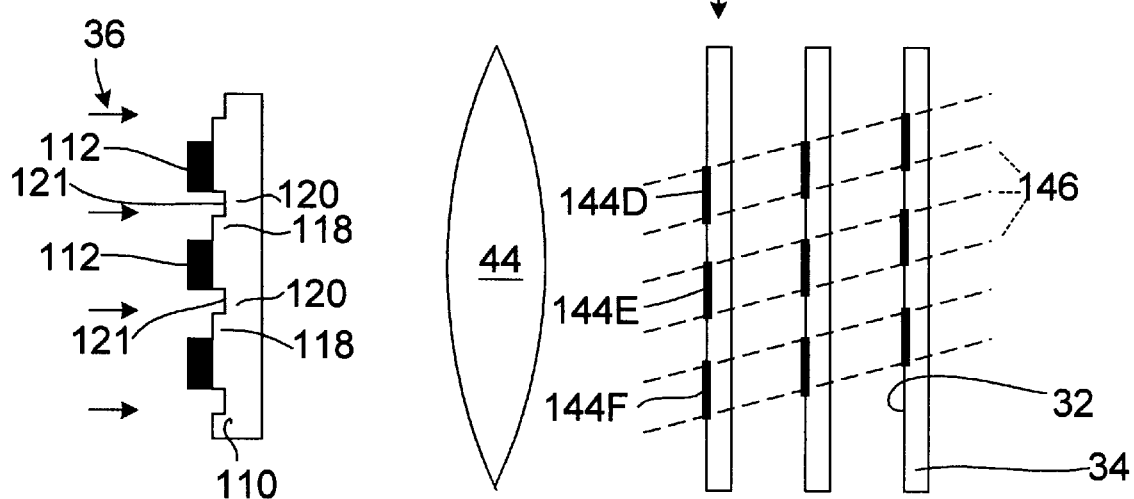
FIG. 10 is a view similar to that shown in FIG. 9, illustrating operation of the lower area of a monitor portion shown in FIG. 7.

FIG. 9 and 10 are similar to FIGS. 3 and 4, but with the monitor portions 100, 102 of FIG. 7 as part of the system 30. FIG. 9 includes a sectional view of the monitor portion 100 taken along the line 9—9 of FIG. 7, showing a cross-section of the upper area 100A of the monitor port 100, while FIG. 10 shows a sectional view of the monitor portion 100 taken along the line 10—10 of FIG. 7, showing a cross-section of the lower area 100B of the monitor portion 100. Similar to the above description with regard to FIG. 3 and 4, with reference to the upper area 100A of the monitor portion 100 (FIG. 9), moving the wafer 34 and lens 44 relatively together and apart causes the shadows 144A, 144B, 144C formed on the photoresist 32 of the wafer 34 (formed by the opaque lines 112) to shift (downward as the wafer 34 and lens 44 are moved relatively further apart). Meanwhile, with reference to the lower area 100B of the monitor portion 100 (FIG. 10), moving the wafer 34 and lens 44 relatively together and apart causes the shadows 144D, 144E, 144F formed on the photoresist 32 of the wafer 34 to shift (upward as the wafer 34 and lens 44 are moved relatively further apart). The dotted areas 146 in FIGS. 9 and 10 indicate the traverse of the shadows 144A–F as the wafer 34 is so moved relatively toward and away from the lens 44.

Figure 11:
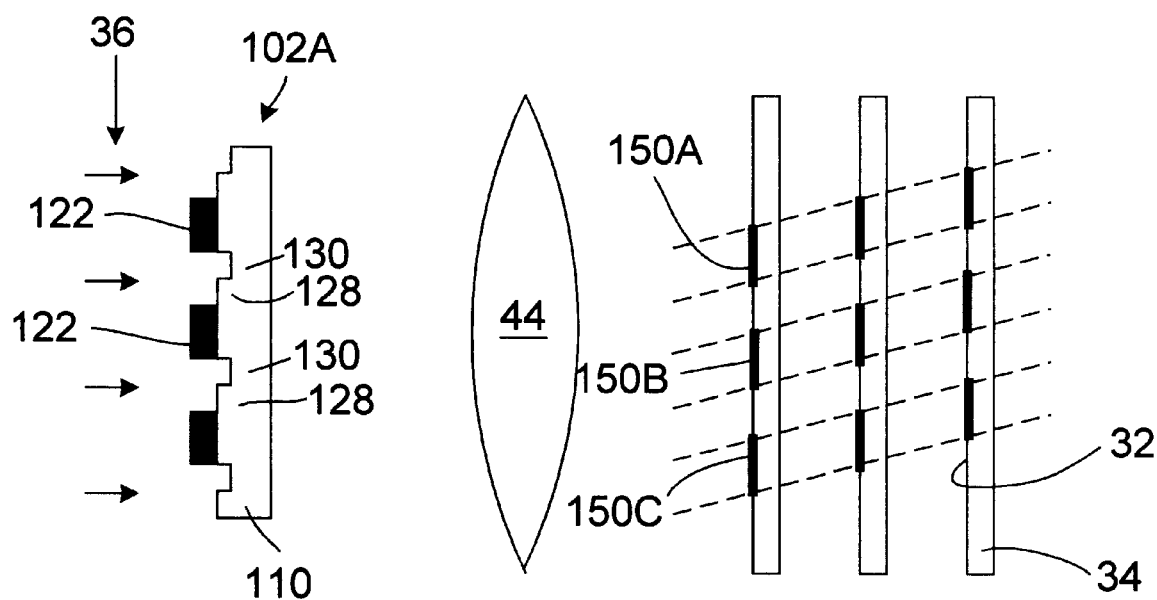
FIG. 11 is a view similar to that shown in FIG. 10, illustrating operation of the lower area of another monitor portion shown in FIG. 7.
Figure 12:
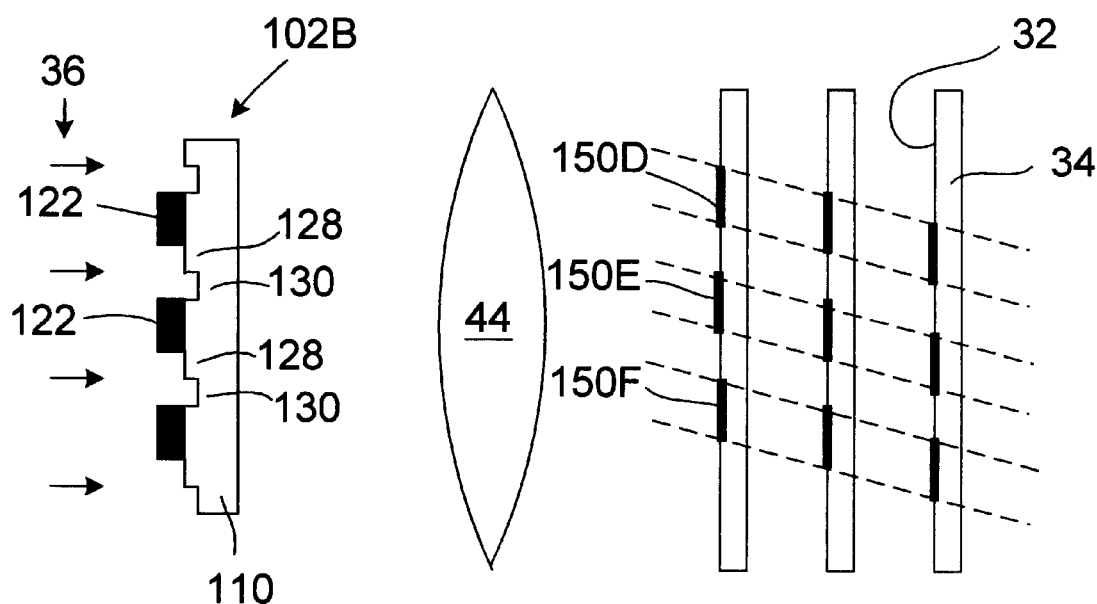
FIG. 12 is a view similar to that shown in FIG. 10, illustrating operation of the upper area of said another monitor portion of FIG. 7.

FIGS. 11 and 12 are also similar to FIGS. 3 and 4, but with the monitor portion 102 as part of the system. FIG. 11 includes a sectional view of the monitor portion 102 taken along the line 11—11 of FIG. 7, showing a cross-section of the upper area 102A of the monitor portion 102, while FIG. 12 shows a sectional view of the monitor portion 102 taken along the line 12—12 of FIG. 7, showing a cross-section of the lower area 102B of the monitor portion 102. In this embodiment, with the phase shifting regions and non phase shifting regions reversed in position as compared to the monitor portion 100 as described above, the movement of the formed shadows 150A–150F will be the opposite of that as described with regard to the monitor portion 100. That is, with reference to the upper area 102A of the monitor portion 102 (FIG. 11), moving the wafer 34 and lens 44 relatively together and apart causes the shadows 150A–C formed on the photoresist 32 of the wafer 34 (formed by the opaque lines 122) to shift (upward as the wafer 34 and lens 44 are moved relatively further apart). Meanwhile, with reference to the lower area 102B of the monitor portion 102 (FIG. 12), moving the wafer 34 and lens 44 relatively together and apart causes shadows 150D–F formed of the photoresist 32 of the wafer 34 to shift (downward as the wafer 34 and lens 44 are moved relatively further apart).

Figures 6A, 6B, 6C, 6D, 6E, 6F:
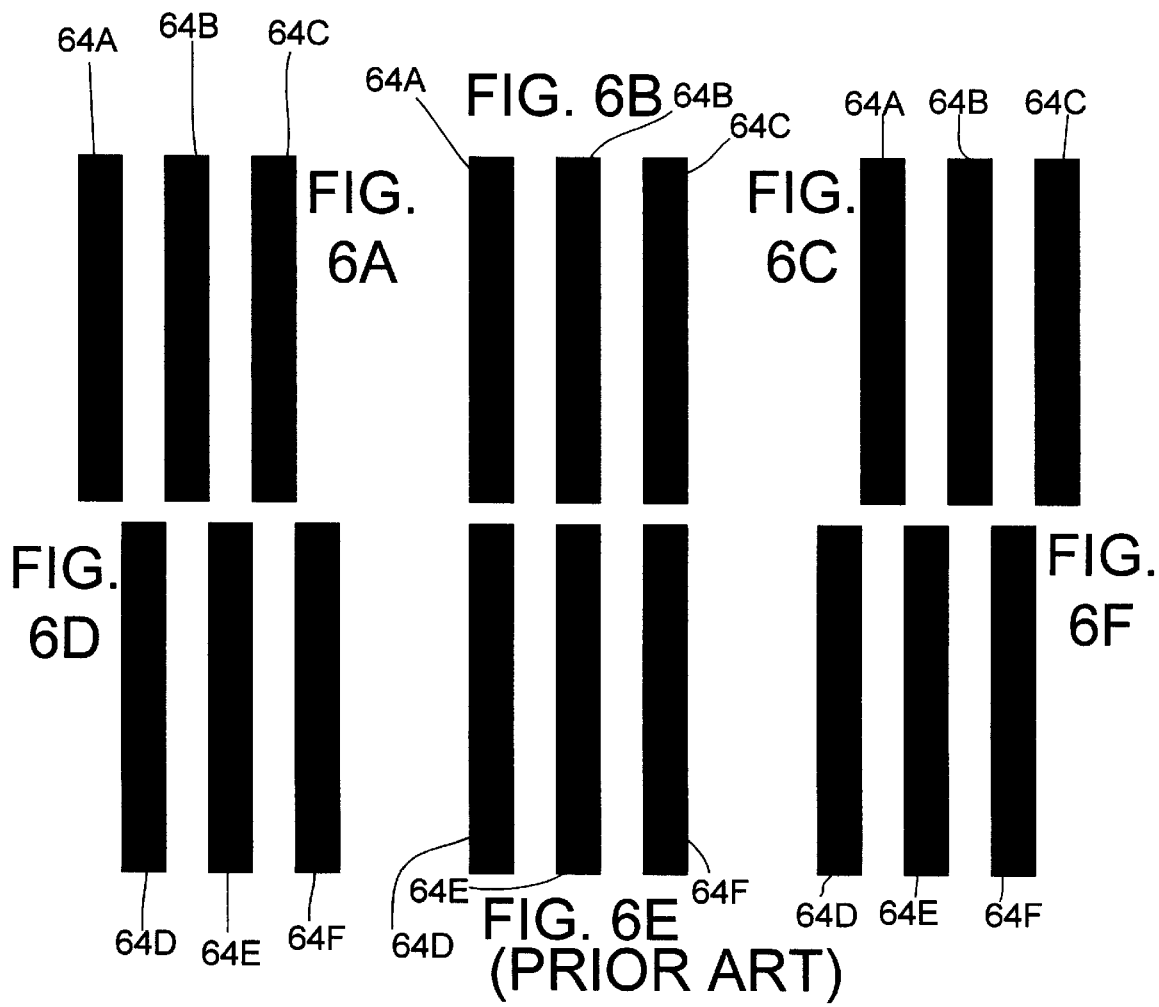
FIG. 6 includes FIGS. 6A–6F further illustrating use of the system of FIGS. 3 and 4.
Figure 13:
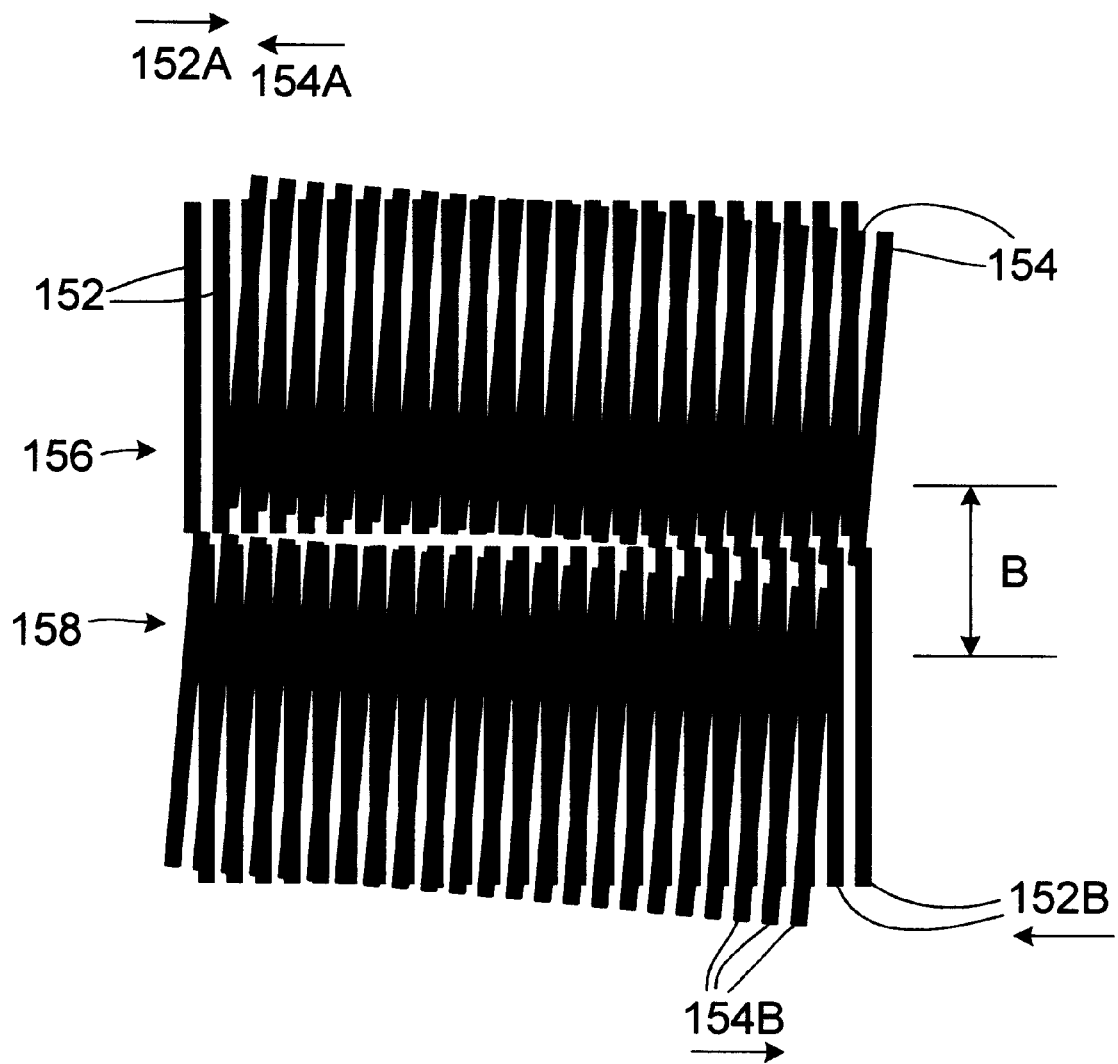
FIGS. 13–15 illustrate moiré fringe patterns formed by use of the monitor portions of FIG. 7.

With the wafer 34 in for example the position shown at X relative to the lens 44 (FIGS. 9 and 10), and the monitor portion 100 positioned to receive light from the light source 36, the photoresist 32 is exposed to light from the light source 36 and is then developed to determine a latent image of lines 152 in the photoresist (FIG. 13) which correspond to the vertical lines 112 of FIG. 7. It will be understood that through the above analysis, the photoresist line portions 152A formed by the upper area 100A may not be aligned with the photoresist line portions 152B formed by the lower area 100B, similar to the situation shown and described above with regard to FIG. 6.

Then, the monitor 108 is moved a distance Y to position the monitor portion 102 to receive light from the light source 36 (the lens 44 and wafer 34 remaining distance X apart), and the photoresist 32 is again exposed to light from the light source 36 and then developed to determine photoresist lines 154 which correspond to the angled lines 122 of FIG. 7. Again, it will be understood that through the above analysis, the line portions 154A formed by the upper area 102A may not be aligned with the line portions 154B formed by the lower area 102B.

Figure 14:
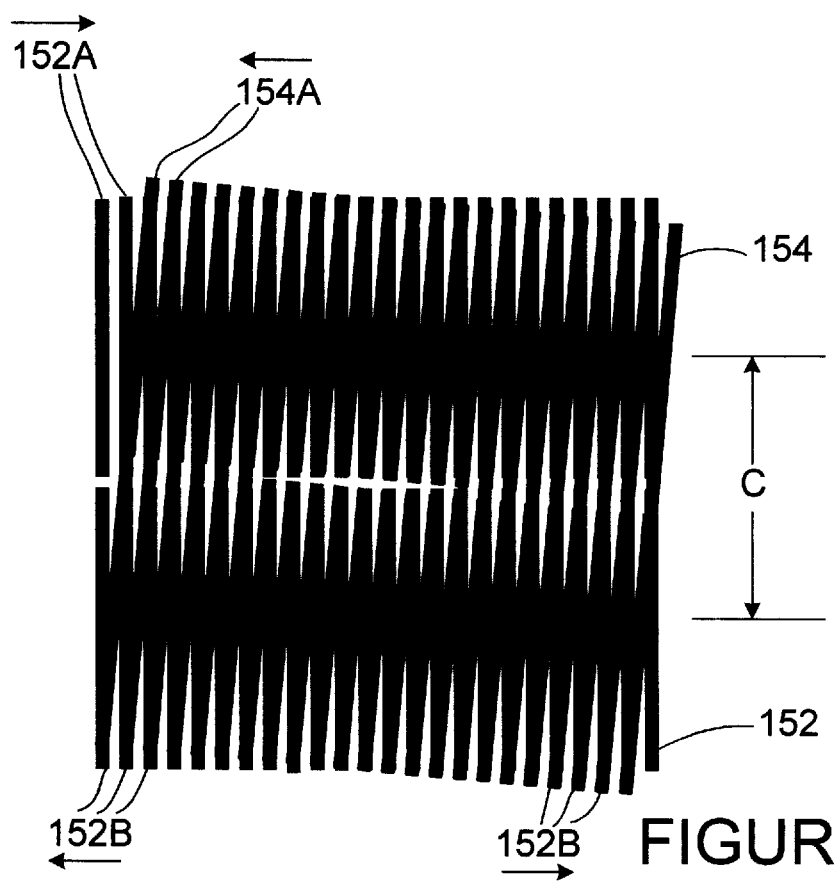
Figure 15:
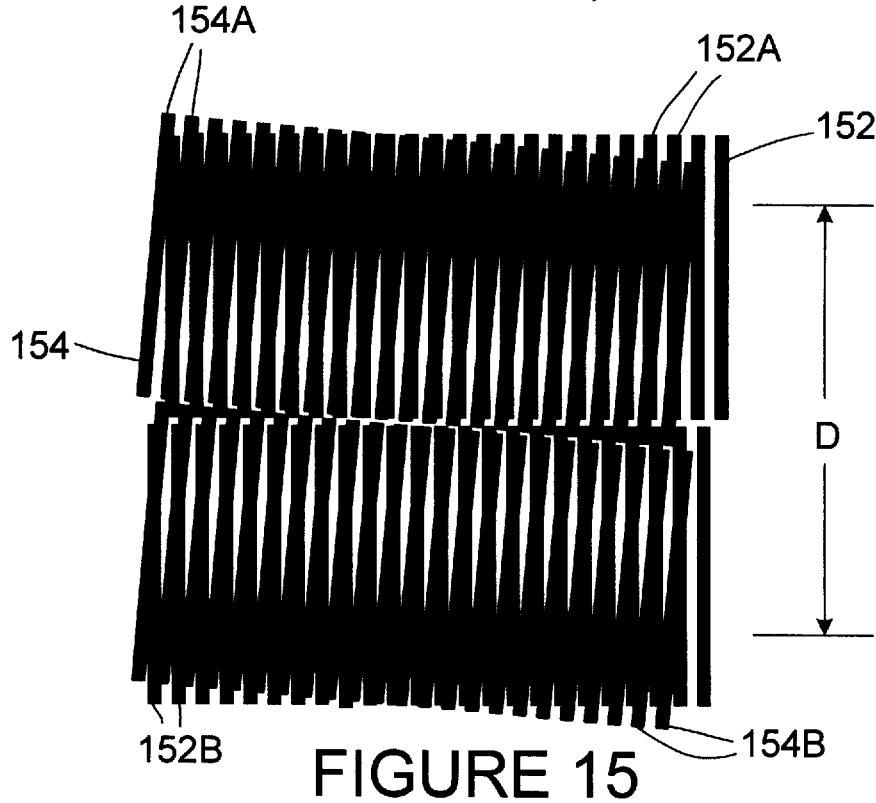
Figure 16:
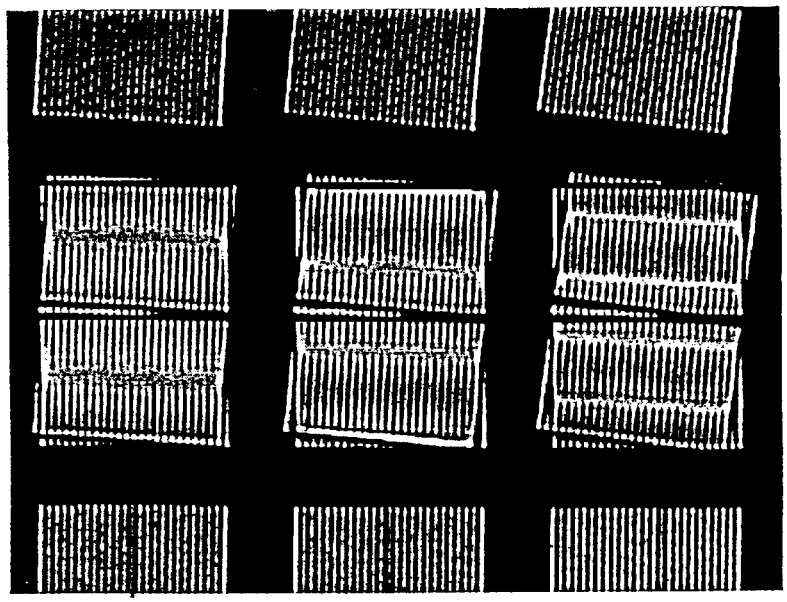
FIG. 16–20 are photographs of results in using the present invention.
Figure 17:
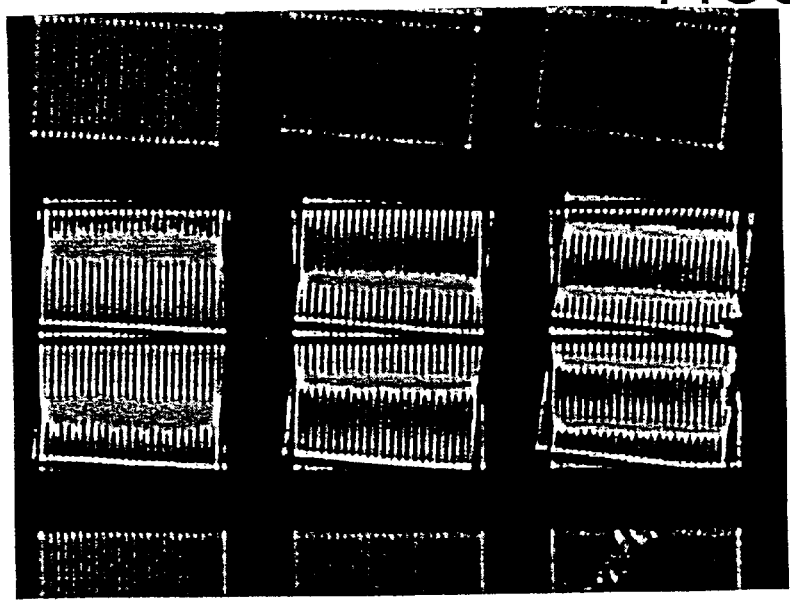
Figure 18:
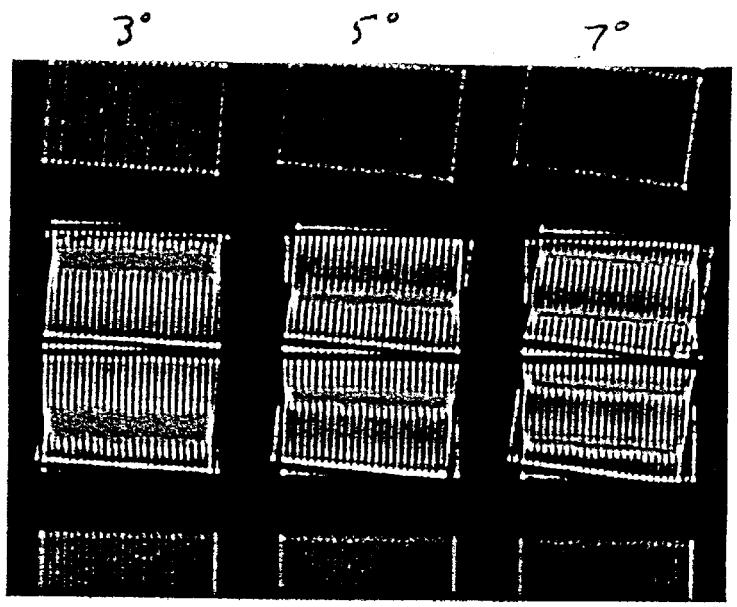
Figure 19:
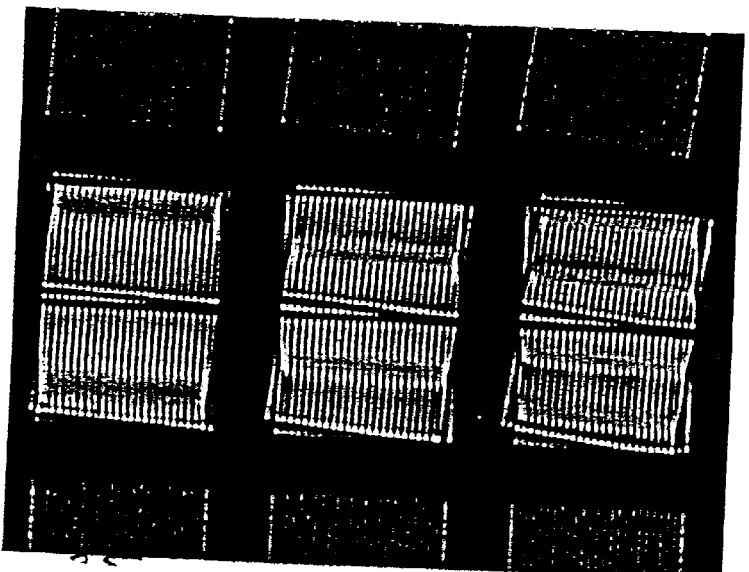

With the lines 154 being at a small angle relative to the lines 152, moiré fringes 156, 158 are formed certain distance B apart. It will be seen that as the lens 44 and wafer 34 are moved relatively further apart, the line portions 154A will shift leftward, as will the line portions 152B. At the same time, the line portions 154B will shift rightward, as will be line portions 152A. With the distance between the lens 44 and wafer 34 so increasing, the lateral shift of the line portions 154A relative to the line portions 152A causes the moiré fringe 156 of FIG. 13 to move upward away from the center of the pattern. At the same time, the lateral shift of the line portions 152B relative to the line portions 154B causes the moir é fringe 158 of FIG. 13 to move downward away from the center of the pattern. The result of this movement is shown in FIG. 14. Thus, moving the wafer 34 and lens 44 relatively closer together from their most far-apart position as described increases the distance between the moiré fringes 156,158, to a distance C. Further such relative movement of the lens 44 toward the wafer 34 causes the distance between the moiré fringes 156,158 to be further increased (Distance D, FIG. 15).

After the formation of the moiré fringe pattern of FIG. 8, which can be used as a baseline pattern, a number of exposures and developments of the photoresist 32 are undertaken as described above for various distances between the wafer 34 and lens 44. Best focus is achieved when the distance between the moiré fringes 154, 156 formed by this series of operations closely matches the distance A between the moiré fringes of the baseline pattern of FIG. 8.

Because of the relatively small angle between the lines 112 and lines 122, i.e., 30 degrees or less, and preferably 10 degrees or less, the moiré fringes 156, 158 move at a much greater rate than the lateral movement of lines as described above with regard to the previous system (FIG. 6). Each moiré fringe 156, 158 is actually moved a distance which is a multiple of the distance moved by the shadows of FIG. 6 of the previous system, the multiple being dependent on the angle between the lines 112 and lines 122, with a smaller angle providing a greater multiple. This provides a much more sensitive reading of focus.

FIG. 15–19 are photographs illustrating the practice of the present invention. The focus is run through a range of 400 nm for angles of one set of lines 112 relative to the other set of lines 122 of 3°, 5° and 7°. It will be seen that the shift in moir é fringe as described above is readily observed in these photographs, and indeed is readily observed within a range of 200 nm or less of relative movement of the lens 44 and wafer 34.

Figure 20:
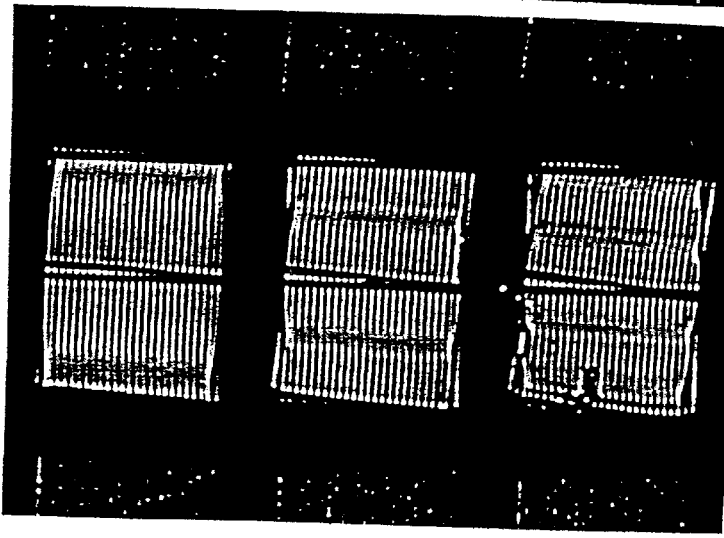
Figure 21:
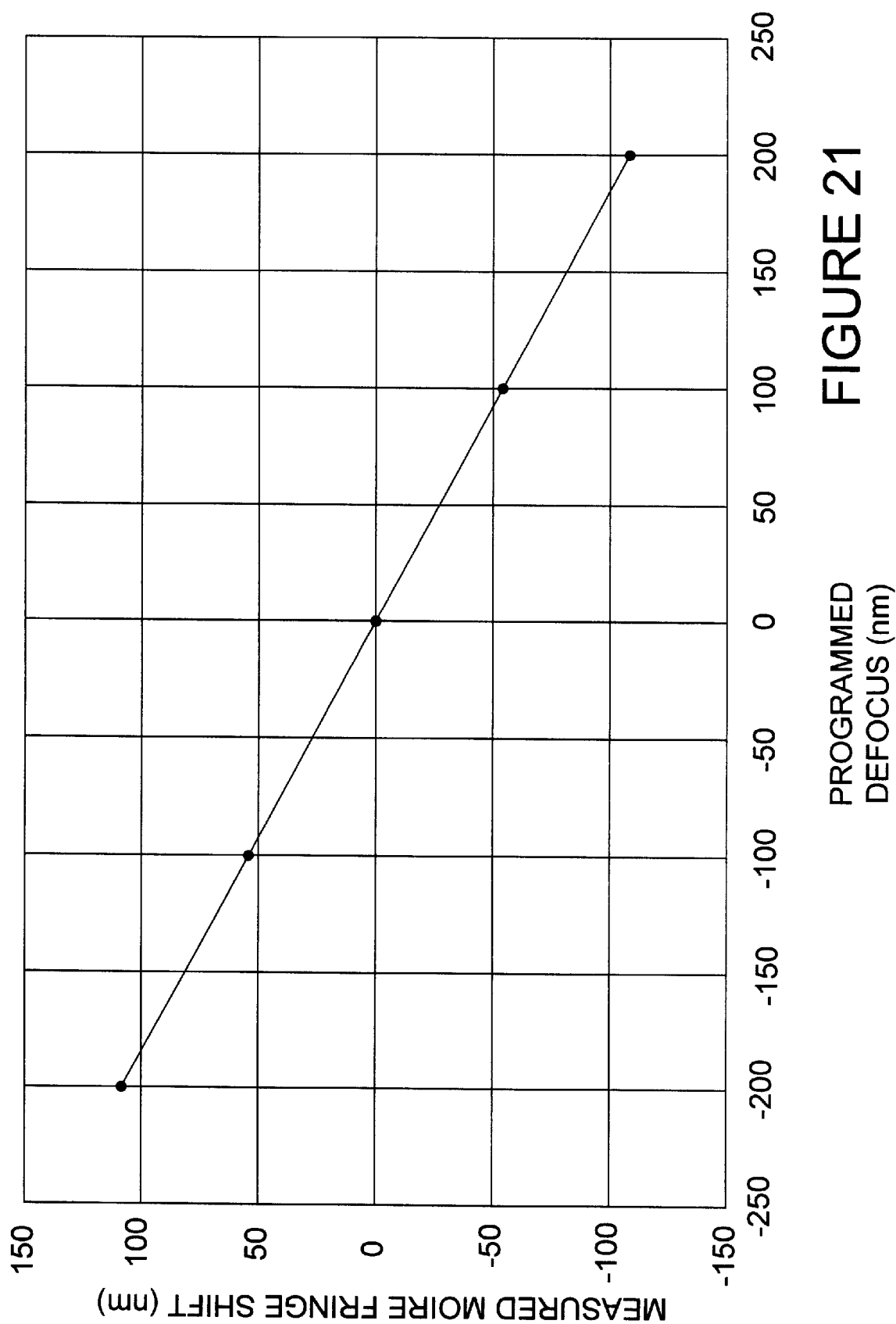
FIG. 21 is a graphical representation of moiré fringe shift plotted against programmed defocus.

FIG. 20 illustrates the sensitivity of the present apparatus, wherein programmed wafer-lens distance is plotted against measured moiré fringe shift, i.e., distance between the moir é fringes as the lens 44 and wafer 34 are moved relatively closer together and further apart. It will readily be observed that the system is quite sensitive well within a range of movement of 200 nm or less.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An optical tool comprising:
   an optical tool body,
   first plurality of substantially opaque, parallel, spaced apart lines on the tool body; and
   a second plurality of substantially opaque, parallel, spaced apart lines on the tool body, the lines of the second plurality thereof being at an angle other than 90° relative to the lines of the first plurality thereof:
   the first and second pluralities of substantially opaque, parallel, spaced apart lines for providing images of the first and second pluralities of lines on an object, a moir é fringe being formed on the object from images of the first and second pluralities of lines.

2. The optical tool of claim 1 wherein the lines of the second plurality thereof are at an angle of 30° or less relative to the lines of the first plurality thereof.

3. The optical tool of claim 2 and further comprising first and second transparent portions between each adjacent pair of the first plurality of lines, each first transparent portion providing transmission of light therethrough at a first phase, each second transparent portion providing transmission of light therethrough at a second phase different from said first phase.

4. The optical tool of claim 3 and further comprising third and fourth transparent portions between each adjacent pair of the second plurality of lines, each third transparent portion providing transmission of light therethrough at the first phase, each second transparent portion providing transmission of light therethrough at the second phase.

5. The optical tool of claim 4 wherein each of the first plurality of lines has an adjacent first and second sides thereof a first transparent portion and a second transparent portion respectively.

6. The optical tool of claim 5 wherein each of the second plurality of lines has adjacent opposite first and second sides thereof a third transparent portion and a fourth transparent portion respectively.

7. The optical tool of claim 6 wherein a first set of corresponding sides of the first plurality of lines each has a first transparent portion adjacent thereto, and wherein a first set of corresponding sides of the second plurality of lines each has a fourth transparent portion adjacent thereto, the first set of corresponding sides of the first plurality of lines also corresponding to the first set of corresponding sides of the second plurality of lines.

8. The optical tool of claim 7 wherein the angle between the lines of the first plurality thereof and the second plurality thereof is 10° or less.

9. The optical tool of claim 8 wherein the first and second phases are substantially 90° apart.

10. An optical tool comprising:
    an optical tool body;
    a first plurality of parallel, substantially opaque, spaced apart lines on the tool body, and having a first set of adjacent ends and a second set of adjacent ends;
    a second plurality of parallel, substantially opaque, spaced apart lines on the tool body, and having first set of adjacent ends and a second set of adjacent ends, to the lines over the first plurality being at an angle of 30° or less relative to the lines of the second plurality, the first set of adjacent ends of the first plurality of lines corresponding to the first plurality of ends of the second plurality of lines;
    each of the first plurality of lines having a first transparent region and a second transparent region along a side of the line, and a third transparent region and a fourth transparent region along the opposite side of the line;
    the first and third transparent regions being on opposite sides of the line and adjacent the first end of The line, the second and fourth transparent regions being on opposite sides of the line and adjacent the second end of the line;
    each of the second plurality of lines having a fifth transparent region and a sixth transparent region along a side of the line, and a seventh transparent region and an eighth transparent region along the opposite side of the line, the fifth and seventh transparent regions being on opposite sides of the line and adjacent the first end of the line, the sixth and eighth transparent regions being on opposite sides of the line and adjacent the second end of the line;
    the first, fourth, fifth and eighth transparent regions providing transmission of light therethrough at a first phase, the second, third, sixth and seventh transparent regions providing transmission of light therethrough at a second phase different from the first phase.

11. The tool of claim 10 wherein the angle between the first plurality of lines and the second plurality of lines is 10° or less.

12. The tool of claim 11 wherein the first and second phases are substantially 90° apart.

13. A method of testing the focus of an image transmitted from a monitor on a semiconductor body comprising:

proviiding an image of a first plurality of parallel lines on the semiconductor body, which lines move relative to the semiconductor body as the semiconductor body is moved relatively toward and away from the monitor:

providing an image of a second plurality of parallel lines on the semiconductor body, which lines move relative to the semiconductor body as the semiconductor body is moved relatively toward and away from the monitor;

The second plurality of parallel lines being at an angle relative to the first plurality of parallel lines, a moiré fringe being formed on the semiconductor body from images of the first and second pluralities of parallel lines thereon; and analyzing the moiré fringe formed on the semiconductor body from images of the first and second pluralities of parallel lines thereon.

14. The method of claim 13 and further comprising the step of providing that the angle between the first and second plurality of lines is 10° or less.

* * * * *